United States Patent
Rezzi et al.

(10) Patent No.: US 11,799,453 B2
(45) Date of Patent: Oct. 24, 2023

(54) ADAPTIVE CONTROL OF CAPACITIVE LOAD

(71) Applicant: INVENTVM Semiconductor SRL, Pavia (IT)

(72) Inventors: Francesco Rezzi, Montebello della Battaglia (IT); Darjn Esposito, Milan (IT); Enrico Oberti, Pavia (IT); Michele Chiabrera, Pavia (IT); Marco Musacci, Borgo San Giovanni (IT)

(73) Assignee: INVENTVM SEMICONDUCTOR SRL, Pavia (IT)

( * ) Notice: Subject to any disclaimer, the term of this patent is extended or adjusted under 35 U.S.C. 154(b) by 0 days.

(21) Appl. No.: 17/698,033

(22) Filed: Mar. 18, 2022

(65) Prior Publication Data

US 2023/0299750 A1    Sep. 21, 2023

(30) Foreign Application Priority Data

Mar. 15, 2022   (EP) .................................... 22162171

(51) Int. Cl.
| | |
|---|---|
| *H03H 17/02* | (2006.01) |
| *H03F 3/183* | (2006.01) |
| *H04R 3/04* | (2006.01) |
| *H04R 29/00* | (2006.01) |
| *H04R 17/00* | (2006.01) |

(52) U.S. Cl.
CPC ............. *H03H 17/02* (2013.01); *H03F 3/183* (2013.01); *H04R 3/04* (2013.01); *H04R 17/00* (2013.01); *H04R 29/001* (2013.01); *H03F 2200/03* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 10,199,555 B2 | 2/2019 | Chaput | |
| 10,666,145 B2 | 5/2020 | Chaput et al. | |
| 10,720,841 B2 | 7/2020 | Chaput et al. | |
| 10,931,199 B2 | 2/2021 | Chaput et al. | |
| 2018/0358945 A1* | 12/2018 | Lindemann | ............ H03G 11/00 |
| 2019/0260333 A1 | 8/2019 | Lindemann | |

FOREIGN PATENT DOCUMENTS

WO    WO-2022008864 A1 *   1/2022   ........... B06B 1/0261

* cited by examiner

*Primary Examiner* — Kenny H Truong
(74) *Attorney, Agent, or Firm* — TUCKER ELLIS LLP (57) ABSTRACT

A circuit for driving a capacitive load includes an amplifier for driving the load based on an input signal, the amplifier comprising at least a boost converter, a dynamic model configured to track a capacitance of the load and a voltage of the source for powering at least parts of the circuit, an adaptive filter, configured to filter the input signal based on an output of the dynamic model.

16 Claims, 6 Drawing Sheets

ADAPTIVE CONTROL OF CAPACITIVE LOAD

RELATED APPLICATION DATA

This application claims the benefit of European Patent Application No. 22162171.7, filed Mar. 15, 2022, the disclosure of which is incorporated herein by reference in its entirety.

TECHNICAL FIELD

The invention deals with a method and a device for driving a capacitive load, preferably a piezoelectric load and/or a micro electro mechanical system (MEMS), even more preferably when the capacitive load is a speaker. Embodiments of the invention allow an advantageous control of the voltage and/or current of a capacitive load driver in a manner that limits the introduction of artefacts in a driving signal.

BACKGROUND

Piezoelectric components are becoming more common in various electronic devices. As an example, a piezoelectric component can be used to generate haptic vibrations and/or a speakers in electronic devices such as mobile phone, tablets, PC, etc. Similarly, MEMS devices are increasingly being used as sensors, such as acceleration sensors, or actuators.

Piezoelectric components and MEMS devices are often seen by a driver, in first approximation, as a capacitive load. This often results in a low impedance. Values under 8 Ohm are for instance common, especially for high frequency signal content. This, in turn, requires a very large current compared to higher impedance loads.

Moreover, in particular in mobile devices, capacitive loads are typically powered by the system battery, whose voltage for a 1S cell generally ranges from 3V to 5V. Common peak voltages when driving a capacitive load—such as for instance a PZT thin film or a MEMS micro speaker—can be higher than 20V.

Therefore, a boost converter is required to raise the battery voltage up to the needed driving level. The current drawn from the battery can then be several times larger than the instantaneous current flowing into the capacitive load.

Thus, a proper control of voltage and/or current should be implemented to avoid triggering protections and/or reaching saturation of one or more components. In particular, various kind of protection circuits can be implemented in the driver, the boost converter, or in the battery itself, to limit voltage and current. Intervention of such protection circuits can generate artefacts in the signal driving the load, or even cause one or more parts of the circuitry to shut down for prevention. Similar situation arise when one or more component along the driving chain saturates.

Figure 1A:
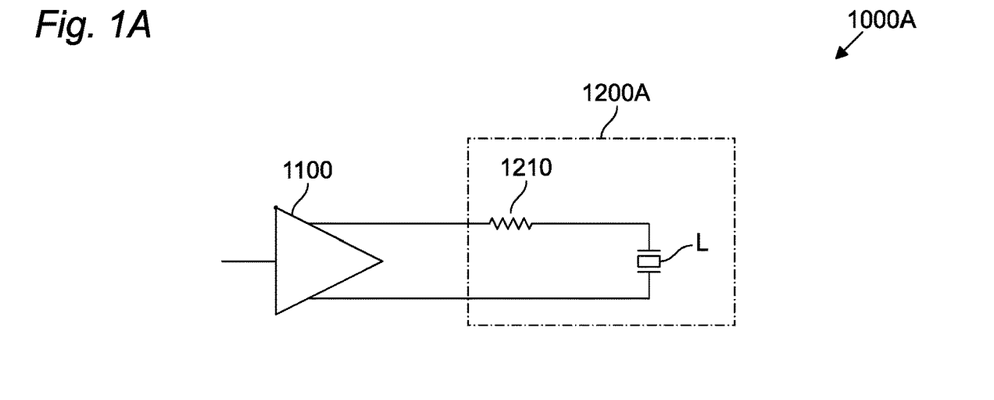
FIGS. 1A-1C schematically illustrate driving circuits 1000A-1000C for a capacitive load L in accordance with the prior art.

FIG. 1A schematically illustrates a circuit 1000A for driving a capacitive load L comprising an amplifier 1100 and a low pass filter 1200A formed by a resistor 1210 and the capacitive load L itself.

In this configuration, the current drawn from amplifier 1100 can be limited at high frequencies, thanks to the low pass filter 1200A. This configuration is however not efficient since the amplifier 1100 is set to output the maximum voltage and/or a significant portion of the output power is dissipated by the series resistor 1210.

Figure 1B:
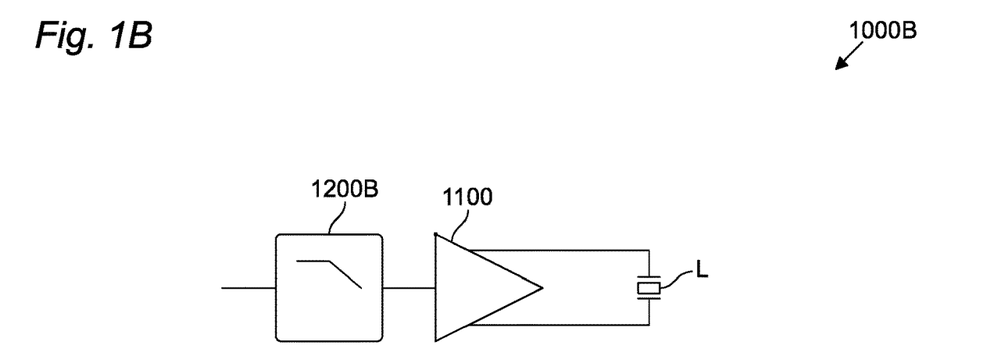

Another known solution is illustrated in FIG. 1B, which schematically illustrates a circuit 1000B for driving a capacitive load L. Here the low pass filter 1200B is positioned before the amplifier 1100, in order to avoid the high power dissipation in the series transistor 1210.

Also in this case, however, the low-pass filter 1200B must be designed for the worst-case scenario. This includes the maximum load capacitance, the maximum input signal amplitude and the maximum frequency. On a battery-operated device, this further includes the lowest battery level. It is evident that such worst-case scenario is not a frequent situation so that, for most of the operating time, the filter 1200B results in an excessive filtering. For instance, in the case of a piezoelectric component used for generating sound, as the capacitive load L, this implementation lowers the available sound to pressure level of the transducer under conditions where this would not normally be needed.

Figure 1C:
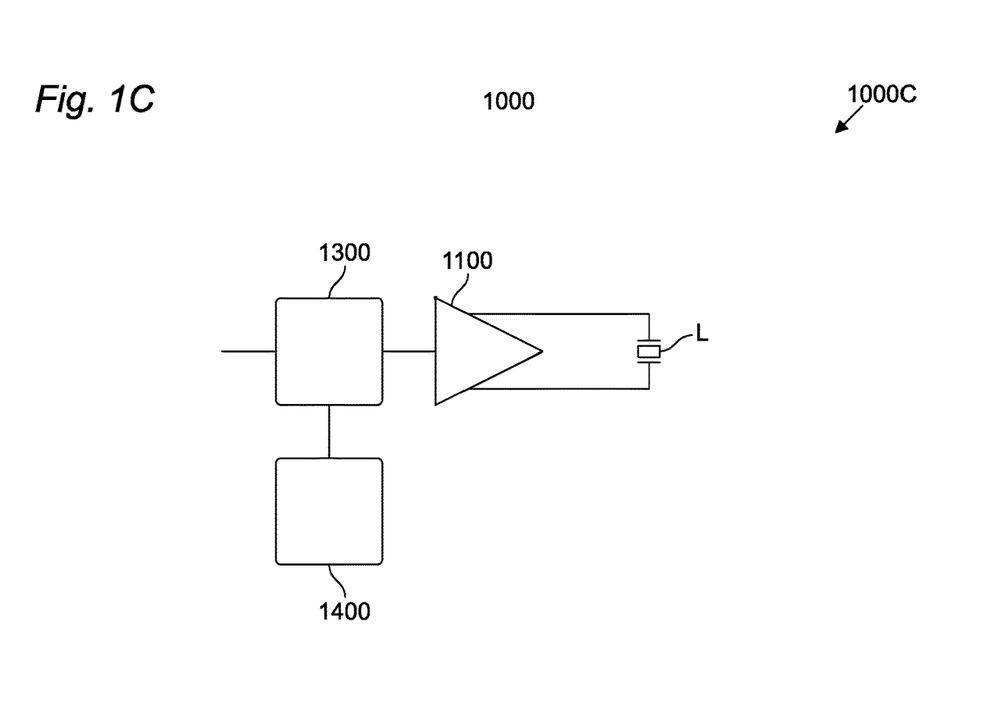

FIG. 1C illustrates a yet another alternative driving circuit 1000C comprising an adaptive filter 1300 and a model 1400 of the load. The adaptive filter 1300 can control voltage and/or current between the input signal and the amplifier 1100 based on the model 1400 of the load L. This can overcome the worst-case filter design limitation, discussed for FIG. 1B, by updating the model in accordance with the specific characteristics of the load, for instance during an initial characterization phase.

This implementation is nevertheless also not ideal, since the load model 1400 is fixed and does not track the load variations. This forces the load model to be based on a worst-case assumption. Moreover, for battery-operated devices, there is no information about the system battery level, so that design assumptions concerning the available current and/or voltage from the battery also have to be made for the worst-case conditions.

There is therefore a need to provide a driving circuit and/or method which allows an efficient driving of a capacitive load, particularly for implementations in battery-operated devices.

SUMMARY

In general, the invention relies on an adaptive filter, whose characteristics are dynamically adjusted. The adjustment can be in particular based on dynamically adjusted characteristics of the load and of the battery. Thanks to the dynamic adjustment of the filter it is possible to maximize the driving signals to the load without introducing artefacts or triggering over current protection mechanisms.

An embodiment of the invention can relate to a circuit for driving a capacitive load comprising: an amplifier for driving the load based on an input signal, the amplifier comprising at least a boost converter, a dynamic model configured to track a capacitance of the load and a voltage of the source for powering at least parts of the circuit, an adaptive filter, configured to filter the input signal based on an output of the dynamic model.

Thanks to this configuration it is advantageously possible to drive the capacitive load by taking into account variations in the capacitance value of the load as well as in the voltage of the power source. This allows the adaptive filter to be operated under conditions representative of the actual driving configuration instead of worst-case scenario configurations, which might otherwise needlessly limit the driving capability.

In some embodiments, the dynamic model can comprise a load current model configured to output a calculated amplifier current, the calculated amplifier current being a current expected to be outputted by the amplifier as a function of at least the input signal and of the tracked capacitance of the load, and/or a boost current model configured to output a calculated boost current, the calculated boost current being a current expected to be outputted by an inductor of the boost converter as a function of at least the input signal and the voltage of the source.

Thanks to this configuration it is advantageously possible to model those values based on easily available input signals. The modelled values can allow the dynamic model to drive the adaptive filter as function of the input signals as well as of the load and power supply conditions.

In some embodiments, the load current model can be configured to receive as input $V_L$ a value representative of the voltage across the load, receive as input $I_L$ a value representative of the current across the load, receive as input $V_{IN}$ a value representative of the input signal, and output the calculated amplifier current $I_{OUT\_PRED}$ as $I_{OUT\_PRED} = f(V_{IN} * Y_L)$ where $Y_L$ is the admittance of the load and where f is a bijective function.

Thanks to this configuration it is advantageously possible to compute the calculated amplifier current $I_{OUT\_PRED}$ in a simple and reliable manner.

In some embodiments, the load current model can comprise a load capacitance model configured to output a calculated capacitance value of the load calculated from $V_L$ and $I_L$, an amplifier model configured to output an expected output voltage of the amplifier calculated from $V_{IN}$, a current calculator configured to calculate the calculated amplifier current based on the calculated capacitance value of the load and on the expected output voltage as $I_{OUT\_PRED} = f(V_{OUT\_PRED} * Y_L)$ where f is a bijective function.

Thanks to this configuration it is advantageously possible to compute the calculated amplifier current $I_{OUT\_PRED}$ in a simple and reliable manner.

In some embodiments, the load capacitance model can comprise a least mean square filter.

Thanks to this configuration it is advantageously possible to simply and reliably compute the load capacitance based on voltage and current measurements of the signals across the load capacitance.

In some embodiments, the load current model can comprise a model of a voltage to current transfer function of the load.

Thanks to this configuration it is advantageously possible to simply and reliably compute the value of $I_{OUT\_PRED}$ by inserting the value of $V_{OUT\_PRED}$ into the transfer function, having $C_L$ as variable In some embodiments, the boost current model can be configured to receive as input $V_{BAT}$ a value representative of the voltage across the source, receive as input $\eta$ a value representative of an efficiency of the boost converter, receive as input $I_{OUT\_PRED}$ a value representative of the calculated amplifier current, receive as input $V_{IN}$ a value representative of the input signal, output the calculated boost current $I_{BST\_PRED}$ as $I_{BST\_PRED} = f[V_{OUT} * I_{OUT\_PRED} / (\eta * V_{BAT})]$ where f is a bijective function.

Thanks to this configuration it is advantageously possible to compute the calculated boost current $I_{BST\_PRED}$ in a simple and reliable manner.

In some embodiments, the boost current model can comprise an amplifier model configured to output an expected output voltage of the amplifier calculated from $V_{IN}$, a current calculator configured to calculate the calculated boost current based on the expected output voltage.

Thanks to this configuration it is advantageously possible to compute the calculated boost current in a simple and reliable manner.

In some embodiments, the dynamic model can further comprise a coefficient computing logic configured to receive as input the calculated amplifier current and/or the calculated boost current, output at least one coefficient for controlling the adaptive filter based on values of at least one of the calculated amplifier current and the calculated boost current.

Thanks to this configuration it is advantageously possible to control the adaptive filter based on the calculated currents, which are a function of the actual driving conditions and not as a function of worst-case considerations.

In some embodiments, the adaptive filter can comprises a variable low-pass filter having as controlling input at least a roll-off coefficient, and the computing logic can be configured to compute the roll-off coefficient as a function of the calculated boost current and/or of the calculated output current.

Thanks to this configuration it is advantageously possible to control the roll-off coefficient of the adaptive filter based on the calculated currents, representing the actual driving conditions.

In some embodiments, the coefficient computing logic can comprise a first peak detector configured to receive as input the calculated amplifier current and determine a maximum calculated amplifier current as a maximum value of the calculated amplifier current, and/or the coefficient computing logic can comprise a second peak detector configured to receive as input the calculated boost current and determine a maximum calculated boost current as a maximum value of the calculated boost current, wherein the coefficient computing logic can comprise a comparator configured to compare the maximum calculated amplifier current with a predetermined maximum amplifier current, and/or compare the maximum calculated boost current with a predetermined maximum boost current, output at least one coefficient based on a result of the comparison.

Thanks to this configuration it is advantageously possible to control the values of the coefficients based on the maximum values reached by the currents, so that the adaptive filter can be controlled based on those maximum values, as those are the values which can cause the most artefacts.

In some embodiments, the adaptive filter can comprise a multiplier having as controlling input at least a multiplier coefficient, and the computing logic can be configured to compute the multiplier coefficient as a function of the calculated boost current and/or of the calculated output current.

Thanks to this configuration it is advantageously possible to provide more flexibility in how the adaptive filter operates on the input signal.

In some embodiments, the coefficient computing logic can comprise at least one smoothing filter configured to receive as input the at least one coefficient, and the dynamic model can be configured to output the at least one coefficient after application of the least one smoothing filter.

Thanks to this configuration it is advantageously possible to avoid fast variations of the filters which might cause artefacts in the amplification.

In some embodiments, the circuit can further comprise a delay element connected between the input signal and the adaptive filter.

Thanks to this configuration it is advantageously possible to allow sufficient time for the processing of the dynamic model.

In some embodiments, the circuit can further comprise a second adaptive filter connected between the input signal and the dynamic model, wherein the second adaptive filter can be configured to provide substantially the same filtering of the adaptive filter, wherein the second adaptive filter is configured to filter the input signal based on the output of the dynamic model.

Thanks to this configuration it is advantageously possible to provide an input to the dynamic model which is representative of the input provided to the amplifier.

In some embodiments, the adaptive filter can comprise a plurality of low-pass filters and high-pass filters for filtering the input signal along at least two branches, preferably three.

Thanks to this configuration it is advantageously possible to allow an easy control of the roll-off of the filter by use of coefficients applied to one or more of the branches.

In some embodiments, the capacitive load can be a speaker based on one or more a piezoelectric components or MEMS.

Thanks to this configuration it is advantageously possible to use the driving circuit for driving the speaker without introducing artefacts and without needlessly limiting the driving power applied to the speaker based on worst-case scenario considerations.

A further embodiment of the invention can relate to a device comprising a speaker and a circuit according to any previous embodiment for driving the speaker.

A further embodiment of the invention can relate to a computing unit comprising a processor and a memory, the memory comprising instructions which, when executed by the processor, cause the processor to operate as the circuit of any of the previous embodiments.

DETAILED DESCRIPTION

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired.

It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

According to the techniques described herein, it is possible to drive a capacitive load in a highly efficient manner, avoiding the triggering of over-voltage or over-current protections which would otherwise introduce artefacts in the driving signal as well as limiting energy consumption.

Figure 2:
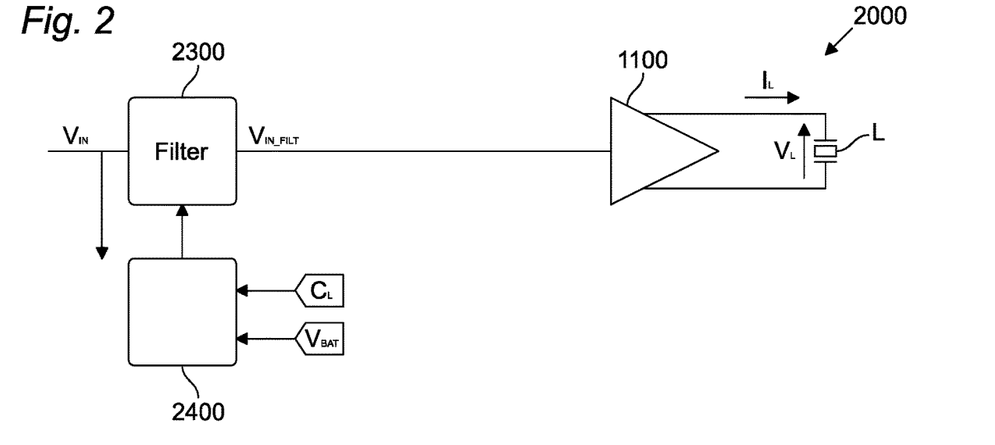
FIG. 2 schematically illustrates a driving circuit 2000.

FIG. 2 schematically illustrates a driving circuit 2000 for a capacitive load L. In the context of the application, unless specified otherwise, the capacitive load can be any of a MEMS load, a piezoelectric component, a capacitor, or any other component which, when driven by a driving circuit, can be—as first approximation—modelled by one or more capacitors. Preferably, the capacitive load is a speaker, even more preferably a speaker implemented by a piezoelectric component.

As visible in FIG. 2, the circuit 2000 comprises an amplifier 1100 for driving the load L based on an input signal $V_{IN}$. In particular, the amplifier 1100 comprises at least a boost converter so as to increase the voltage from a lower level $V_{IN\_FILT}$ to a higher lever $V_L$. In this manner it is possible to drive loads L which require higher driving voltages.

The circuit 2000 further comprises a dynamic model 2400 configured to track a capacitance $C_L$ of the load L and a voltage $V_{BAT}$ of the source, for instance a battery, for powering at least parts of the circuit 2000. In particular, the source is configured for powering at least the amplifier 1100. In preferred embodiments, the source can be configured for powering the entire circuit 2000.

While in this embodiment and throughout the remaining description reference is made to a battery, as energy source for driving the circuit 2000, it will be clear that similar considerations can apply to any other source, for instance any kind of voltage generator. The invention is particularly advantageous when applied to battery operated devices, as the voltage of the battery might change more than that of other sources, such as an AC powered voltage generator. However, the invention is not limited thereto.

The tracking of the voltage $V_{BAT}$ can be achieved in known manners, for instance through a voltage sensor. It is noted that, for operating, the invention does not need the voltage $V_{BAT}$ to correspond, in terms of Volts, to the tracked source voltage. It is sufficient that the voltage $V_{BAT}$ provides an indication of the tracked source voltage. That is, the voltage $V_{BAT}$ can result from any bi-univocal function applied to the tracked source voltage.

The tracking of the capacitance $C_L$ can be also performed in known manners, for instance by measuring voltage $V_L$ and current $I_L$ and then computing capacitance $C_L$ therefrom.

Additionally the circuit 2000 further comprises an adaptive filter 2300, configured to filter the input signal $V_{IN}$ based on an output of the dynamic model 2400. Preferably, the adaptive filter 2300 can implement at least a low-pass filter having a predetermined cut-off frequency and roll-off value.

In general, in some embodiments, the dynamic model 2400 can provide an output to the adaptive filter 2300 which causes the adaptive filter 2300 to increase filtering when the voltage $V_{BAT}$ is reduced. Alternatively, or in addition, the dynamic model 2400 can provide an output to the adaptive filter 2300 which causes the adaptive filter 2300 to increase filtering when the capacitance $C_L$ is increased. Here, the increase of the filtering can be understood as to mean applying a lower cut-off frequency, and/or a higher roll-off value.

By tracking the capacitance of the load $C_L$ and the voltage of the source $V_{BAT}$, the model 2400 can advantageously consider both parameters and avoid being designed for worst-case conditions or one or both of those parameters. This, in turn, allows the increase of the filtering to be limited to the conditions in which this is actually needed, thus avoiding excessive filtering which can lower the performances of the circuit 2000.

It is thus evident that several possible embodiments can be implemented so as to achieve the behaviour described above for the adaptive filter 2300 and its influence on the dynamic model 2400. In the following, some possible implementations will be described, the invention is however not limited thereto.

Figure 3:
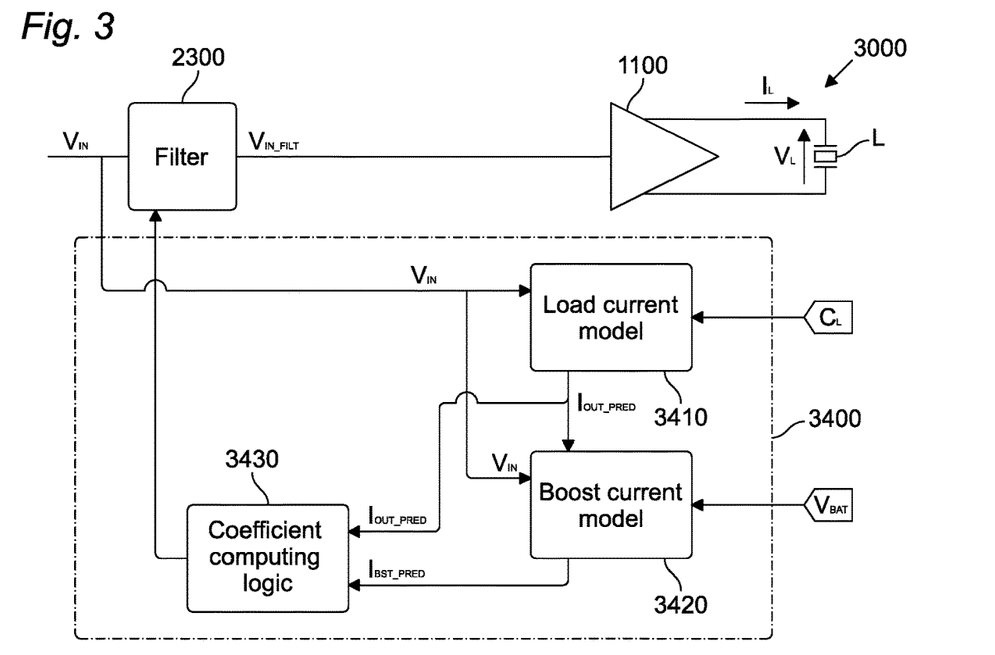
FIG. 3 schematically illustrates a driving circuit 3000 and FIG. 3A schematically illustrates an amplifier 3100, comprising a boost converter.

FIG. 3 illustrates a circuit 3000 which differs from circuit 2000 due to the additional presence of blocks 3410, 3420 and 3430 in the dynamic model 3400, which might provide one example of an implementation of the dynamic model 2400. Although the illustrated embodiments operates with both blocks 3410 and 3420, it will be clear that, in some embodiments, only one of them might be implemented.

In particular, the dynamic model 3400 comprises a load current model 3410 configured to output a calculated amplifier current $I_{OUT\_PRED}$, the calculated amplifier current $I_{OUT\_PRED}$ being a current expected to be outputted by the amplifier 1100 as a function of at least the input signal $V_{IN}$ and of the tracked capacitance of the load $C_L$.

Alternatively, or in addition, the dynamic model 3400 comprises a boost current model 3420 configured to output a calculated boost current $I_{BST\_PRED}$, the calculated boost current $I_{BST\_PRED}$ being a current expected to be outputted by an inductor of the boost converter as a function of at least the input signal $V_{IN}$ and the voltage of the source $V_{BAT}$.

Figure 3A:
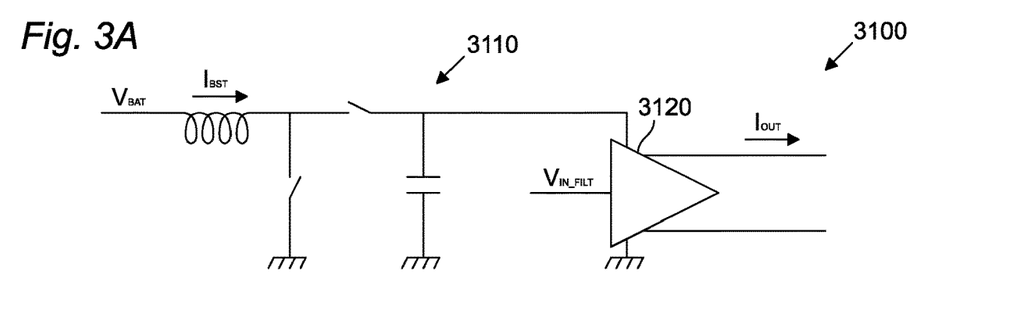

To clarify the meaning of those currents, FIG. 3A schematically illustrates an amplifier 3100, comprising a boost converter 3110 and a driver 3120, powered by the boost converter 3110. It will be clear to those skilled in the art that several alternative potential implementations are however possible.

The calculated amplifier current $I_{OUT\_PRED}$ can be understood as being a computed version of the current $I_{OUT}$ to be outputted by the amplifier 3100, and in particular by the driver 3120, as a function of a number of input parameters, including the input signal $V_{IN}$ and the capacitance of the load $C_L$. Similarly, the calculated boost current $I_{BST\_PRED}$ can be understood as being a computed version of the current $I_{BST}$ expected to cross the inductor in the boost converter 3110, as a function of a number of input parameters, including the input signal $V_{IN}$ and the voltage of the source $V_{BAT}$.

The use of the indicated input parameters, for the respective current, allows a computation of the current which is both simple and reliable enough for further processing. Moreover the computation of the calculated amplifier current $I_{OUT\_PRED}$, and/or of the calculated boost current $I_{BST\_PRED}$, advantageously allows to provide a dynamic model 3400 which can be used to more finely control the adaptive filter 2300 than with other parameters.

It will be clear that the specific relationship between the calculated values and the respective input parameters can be depending on the specific topology of the amplifier, so that the skilled person will know how to compute the indicated values once the topology of the amplifier is defined.

In some embodiments, the function relating the calculated amplifier current $I_{OUT\_PRED}$ and the input signal $V_{IN}$ can be such that $I_{OUT\_PRED}$ increases as $V_{IN}$ increases, and/or $I_{OUT\_PRED}$ decreases as $V_{IN}$ decreases. Alternatively, or in addition, the function relating the calculated amplifier current $I_{OUT\_PRED}$ and the capacitance $C_L$ can be such that $I_{OUT\_PRED}$ increases as $C_L$ increases, and/or $I_{OUT\_PRED}$ decreases as $C_L$ decreases.

Similarly, in some embodiments, the function relating the calculated boost current $I_{BST\_PRED}$ and the input signal $V_{IN}$ can be such that $I_{BST\_PRED}$ increases as $V_{IN}$ increases, and/or $I_{BST\_PRED}$ decreases as $V_{IN}$ decreases. Alternatively, or in addition, the function relating the calculated boost current $I_{BST\_PRED}$ and the source voltage $V_{BAT}$ can be such that $I_{BST\_PRED}$ increases as $V_{BAT}$ decreases, and/or $I_{BST\_PRED}$ decreases as $V_{BAT}$ increases.

Figure 4A:
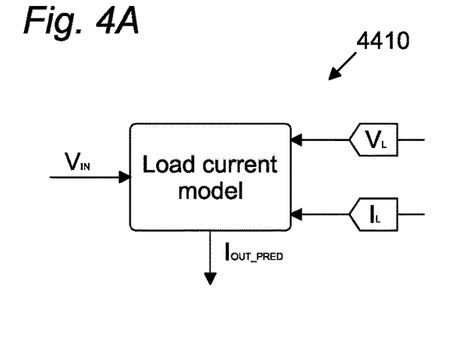
FIGS. 4A and 4C schematically illustrates possible components of a load current model 4410 while FIG. 4B schematically illustrates a possible modelling of a load L.

FIG. 4A schematically illustrates a load current model 4410, which can be a possible implementation of the load current model 3410. The load current model 4410 is configured to receive inputs $V_L$ and $I_L$ respectively representative of the voltage and current values across the load L or, as will be described more in details in the following, across a capacitance value of the load L.

Here, the term "a value representative of" is intended to indicate that the values inputted to the load current model 4410 allow the load current model 4410 to determine the respective value across the load. For instance, the input $V_L$ can be, simply, the voltage $V_L$ measured across the load. In other words, the term "a value representative of" can be interpreted, in its most direct implementation, as corresponding to the respective value.

However, the invention is not limited thereto and any value for $V_L$ received by the load current model 4410, which allows the load current model 4410 to determine the voltage $V_L$ measured across the load, can be used instead. For instance, the value $V_L$ received by the load current model 4410 can be the voltage $V_L$ measured across the load multiplied by a coefficient. Alternatively, or in addition, the value $V_L$ received by the load current model 4410 can be a digital representation of the analog voltage $V_L$ measured across the load. Still alternatively, or in addition, the value $V_L$ received by the load current model 4410 can be a current value which is a function of the voltage value $V_L$ measured across the load. Similar considerations apply to the input $I_L$.

The load current model 4410 is further configured to receive as input $V_{IN}$ a value representative of the input signal $V_{IN}$. The same considerations above apply, for how input $V_{IN}$ to the load current model 4410 can be a value representative of the input signal $V_{IN}$.

The load current model 4410 is then configured to output a calculated amplifier current $I_{OUT\_PRED}$ as $$I_{OUT\_PRED} = f(V_{IN} * k * Y_L) \qquad \text{(Eq. 1)}$$

where $Y_L$ is the admittance of the load L, k is a multiplication factor, preferably corresponding to the multiplication of amplifier 1100, and where f is a bijective function. In some implementations, the function f can simply be the identity function, that is, f can be removed from the equation above.

It is therefore clear how the calculated amplifier current $I_{OUT\_PRED}$ can be easily and reliably be calculated based on the input parameters. In particular, it will be clear to those skilled in the art how the admittance $Y_L$ of the load L can be derived from the remaining input parameters, namely inputs $V_L$ and $I_L$.

In some embodiments, the load L for the purpose of the computation of the admittance $Y_L$ can be derived from the capacitance C of the load L alone. Alternatively, or in addition, the load L can be modelled to comprise the capacitance C, in series with one or more of an inductance L1, an inductance L2 and a resistor R1.

Figure 4B:
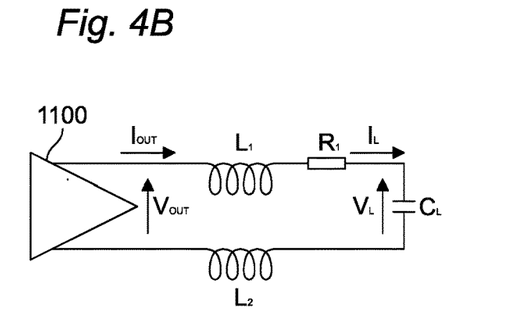

More specifically, as visible in FIG. 4B, the load L as seen by the amplifier 1100 can be modelled by a series connection of, in order, one or more of $L_1$, $R_1$, $C_L$ and $L_2$. Although all of $L_1$, $R_1$, $C_L$ and $L_2$ are illustrated in FIG. 4B it will be clear that the invention is not limited to this specific model, as the skilled person is aware of alternative manners for modelling the load L. In some embodiments, the inputs $V_L$ and $I_L$ can be understood to relate to measurements taken across the capacitance $C_L$ and thus be used to derive the value of this capacitance in a known manner. The remaining parameters of the model, for instance $L_1$, $R_1$ and $L_2$, can be set to predetermined values, based on the known configuration of the load L.

Figure 4C:
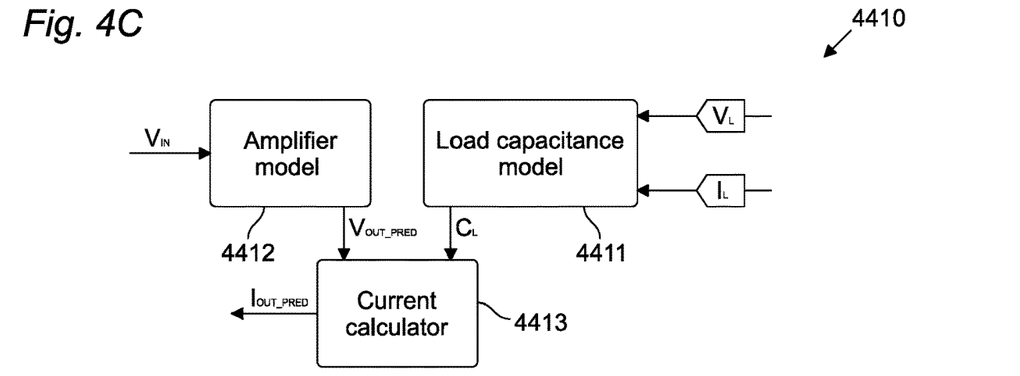

FIG. 4C schematically illustrates further details on how the load current model 4410 can be implemented, in some embodiments. In particular, in the illustrated implementation, the load current model 4410 can comprise a load capacitance model 4411 configured to output a calculated capacitance value $C_{L\_PRED}$ of the load L calculated from $V_L$ and $I_L$. As discussed above, the computation of a capacitance value from the voltage and currents measures across the capacitance is known to the skilled person.

The load current model 4410 can further comprise an amplifier model 4412 configured to output an expected output voltage $V_{OUT\_PRED}$ of the amplifier calculated from $V_{IN}$. That is, the amplifier model 4412 can model the operation of the amplifier 1100. In this manner it is possible to compute the output $V_{OUT\_PRED}$ that the amplifier 1100 presents, when provided with an input $V_{IN}$. The amplifier model 4412 can be a simple gain stage or a more complex transfer function. In some embodiments, the amplifier model 4412 could depend on the signal frequency. In its simplest form, $V_{OUT\_PRED}$ can be obtained by $V_{IN}$ by multiplying $V_{OUT\_PRED}$ by a multiplication factor applied by the amplifier 1100. The load current model 4410 can further comprise a current calculator 4413 configured to calculate the calculated amplifier current $I_{OUT\_PRED}$ based on the calculated capacitance value $C_{L\_PRED}$ of the load L and on the expected output voltage $V_{OUT\_PRED}$ as $$I_{OUT\_PRED} = f(V_{OUT\_PRED} * Y_L) \qquad \text{(Eq. 2)}$$

where f is a bijective function. In some implementations, the function f can simply be the identity function, that is, f can be removed from the equation above.

Also in this case, the previous considerations made on $Y_L$ apply. That is, the load L might be modelled by a circuit comprising more than the capacitance $C_L$ computed by the load capacitance model 4411, and the computation of the resulting admittance $Y_L$, at the current calculator 4413, can take that into account, in known manners. In other words, the load current model 4410 allows tracking of a variable component $C_L$ of the load. Any other components of the load L can be assigned to a predetermined value, based on the design of the load L.

As indicated above, the skilled person is aware of several manners for computing the value of $C_L$ based on the inputs $V_L$ and $I_L$. In a possible specific implementation, the load capacitance model 4411 can comprise a least mean square filter.

In particular, the load capacitance admittance can be defined as a function of $C_L$, for instance as $s*C_L$, and it can be represented in a discrete way as az−b/z+1 in a known manner.

The least mean square filter algorithm can be used to calculate the coefficients a and b, in a known manner, and thus the value of $C_L$.

Moreover, in some embodiments, the load current model 4410 can comprises a model of a voltage to current transfer function of the load L, and/or of the capacitance value $C_L$ of the load L. In this manner, the value of $I_{OUT\_PRED}$ can be simply computed by inserting the value of $V_{OUT\_PRED}$ into the transfer function, having $C_L$ as variable.

Several manners have thus been described for the computation of a predicted value $I_{OUT\_PRED}$ of the current $I_{OUT}$, that is, of the current that would be outputted by the amplifier 1100 as a function of a given load L, in particular of a given capacitance $C_L$ of the load L, and as function of a given input signal $V_{IN}$.

This enables the dynamic model to compute what current $I_{OUT\_PRED}$ would be outputted by the amplifier 1100, should this current be available. As will become clearer in the following, this current can be compared to threshold values so that if the $I_{OUT\_PRED}$ cannot be achieved, the dynamic model can provide an indication to the adaptive filter 2300, in order to act on the signal $V_{IN}$ so as to bring the current $I_{OUT}$ to a value which can be sustained.

Moreover, as the computation of the current $I_{OUT\_PRED}$ is a function of the status of the load L, in particular of the status of a variable capacitance component $C_L$ of the load L, the model can track, potentially and preferably in real time, the actual status of the load L instead of being pre-programmed to take into account the worst case scenario, in which the load L is drawing as much current as allowed by the design.

This is a significant advantage since, as it is known to those skilled in the art, semiconductor components can have characteristics with rather large ranges when evaluated under all possible conditions, such as process, age, temperature and driving conditions. However, the worst case scenario, namely the worst possible combination of those characteristics, is an event which is statistically very unlikely to happen, so that designing the model 2400 on a static set of parameters leads to severe filtering by filter 2300 which, in most cases, is not needed.

The description above provided details on how the calculated amplifier current $I_{OUT\_PRED}$ can be computed. In the following, it will be described how the calculated boost current $I_{BST\_PRED}$ can be computed. Considerations made above for the modelling of the load L continue to apply.

Figure 5A:
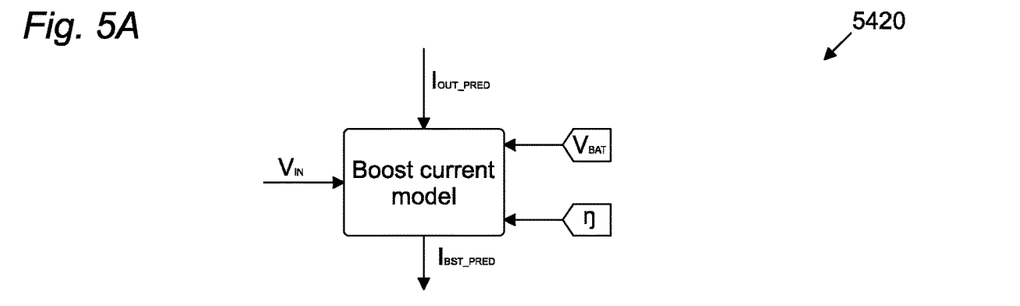
FIGS. 5A and 5B schematically illustrates possible components of a boost current model 5420.

FIG. 5A schematically illustrates a boost current model 5420, which can be a possible implementation of the boost current model 3420. The boost current model 5420 is configured to receive as inputs:

$V_{BAT}$, a value representative of the voltage across the source,

η, a value representative of an efficiency of the boost converter 3110, $I_{OUT\_PRED}$, a value representative of the calculated amplifier current, $V^{IN}$, a value representative of the input signal, output the calculated boost current $I_{BST\_PRED}$ as $$I_{BST\_PRED} = f[V_{OUT} * I_{OUT\_PRED}(\eta * V_{BAT})]$$

where $V_{OUT}$ can be computed from $V_{IN}$ in a known manner, for instance by the multiplication of $V_{IN}$ and the amplification factor of the amplifier 1100, and where f is a bijective function. In some implementations, the function f can simply be the identity function, that is, f can be removed from the equation above.

This allows the calculated boost current $I_{BST\_PRED}$ to be easily and reliably computed. The value of the calculated boost current $I_{BST\_PRED}$ provides an important indication on the current which is drawn from the power supply source, and, as will become clearer in the following, can be used to determine if this value is higher than what the power supply source can provide, which indicates that filtering is needed.

Moreover, by re-using the calculated amplifier current $I_{OUT\_PRED}$, the dynamic model 3400 can make an efficient use of computational resources which have already been employed.

Figure 5B:
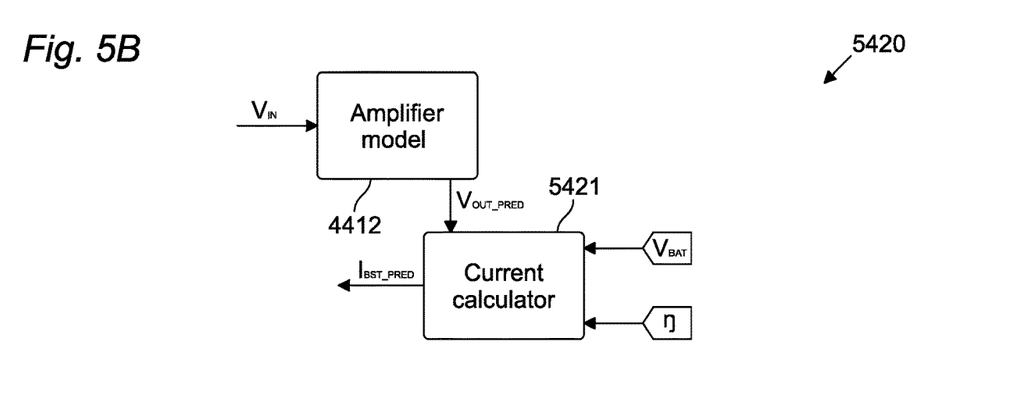

FIG. 5B schematically illustrates further details on how the boost current model 5420 can be implemented, in some embodiments. In particular, in the illustrated implementation, the boost current model 5420 can comprise an amplifier model 4412 configured to output an expected output voltage $V_{OUT\_PRED}$ of the amplifier calculated from $V_{IN}$.

While the amplifier model 4412 is shown in FIG. 5B as being in addition to the one shown in FIG. 4C, it will be clear to those skilled in the art that the same amplifier model 4412 can be shared by the models 4410 and 5420. For instance, a single amplifier model could be connected to $V_{IN}$, so at to provide both blocks 3410 and 3420 with an expected output voltage $V_{OUT\_PRED}$. Alternatively, or in addition, the model 4410 can output the value of $V_{OUT\_PRED}$ to the model 5420, in addition to the value of $I_{OUT\_PRED}$.

The boost current model 5420 can further comprise a current calculator 5421 configured to compute the calculated boost current $I_{BST\_PRED}$ based on the expected output voltage $V_{OUT\_PRED}$ in a manner which will be clear to those skilled in the art.

In some embodiments, the current calculator 5421 can implement a function which provides an increase in the calculated boost current $I_{BST\_PRED}$ when the expected output voltage $V_{OUT\_PRED}$ increases, and/or a decrease in the calculated boost current $I_{BST\_PRED}$ when the expected output voltage $V_{OUT\_PRED}$ decreases. Alternatively, or in addition, the current calculator 5421 can implement a function which provides an increase in the calculated boost current $I_{BST\_PRED}$ when the source voltage $V_{BAT}$ decreases, and/or a decrease in the calculated boost current $I_{BST\_PRED}$ when the source voltage $V_{BAT}$ increases.

This provides an efficient manner for computing the calculated boost current $I_{BST\_PRED}$.

It has thus been described how the calculated boost current $I_{BST\_PRED}$ and/or the calculated amplifier current $I_{OUT\_PRED}$ can be computed. As noted above, those values do not need to identically numerically represent the respective currents. That is, it is sufficient that the values of the calculated boost current $I_{BST\_PRED}$ and/or the calculated amplifier current $I_{OUT\_PRED}$ are linked in a known manner, through the bijective function f, to the respective currents.

As an example, if the amplifier current is corresponding to 10 mA, for a given set of inputs, the calculated amplifier current $I_{OUT\_PRED}$ can be expressed, for instance if expressed as a voltage, as X Volts, as long as it is possible to associate the value mA to the value of X.

Based on the calculated boost current $I_{BST\_PRED}$ and/or the calculated amplifier current $I_{OUT\_PRED}$, the dynamic model 3400 can provide one or more output to the adaptive filter 2300, which influence the operation of the adaptive filter 2300.

In general, if the value of any of the calculated boost current $I_{BST\_PRED}$ and/or the calculated amplifier current $I_{OUT\_PRED}$ is over a respective predetermined threshold, the dynamic model 3400 can provide one or more output to the adaptive filter 2300, which causes the adaptive filter 2300 to increase filtering of the input signal $V_{IN}$. More specific manners of operation implementing this general concept will be described more in details in the following.

Figure 6:
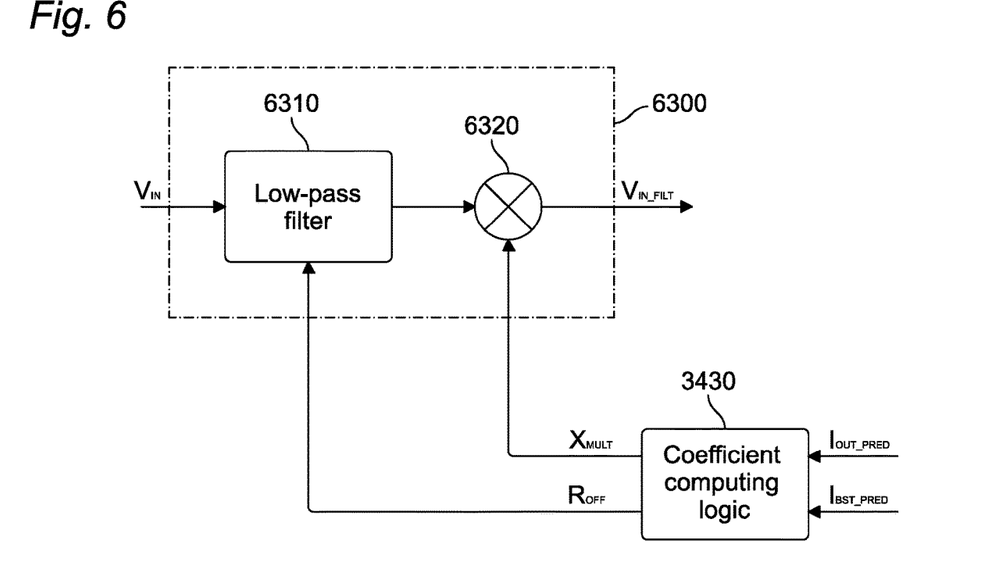
FIG. 6 schematically illustrates possible components of a filter 6300.

As visible in FIGS. 3 and 6, the dynamic model 3400 can further comprises a coefficient computing logic 3430 configured to receive as input the calculated amplifier current $I_{OUT\_PRED}$ and/or the calculated boost current $I_{BST\_PRED}$, and output at least one value for controlling the adaptive filter 6300 based on values, preferably maximum values, of at least one of the calculated amplifier current $I_{OUT\_PRED}$ and the calculated boost current $I_{BST\_PRED}$.

In particular, the adaptive filter 6300 can comprise a low-pass filter 6310, whose roll-off coefficient can be controlled by the value of $R_{OFF}$. For instance, as $R_{OFF}$ increases, the roll-off coefficient can increase and as $R_{OFF}$ decreases, the roll-off coefficient can decrease. Alternatively, or in addition, the adaptive filter 6300 can comprise a multiplier whose multiplication coefficient can be controlled by the value of $X_{MULT}$. For instance, as $X_{MULT}$ increases, the multiplication coefficient can increase and as $X_{MULT}$ decreases, the multiplication coefficient can decrease. In the following description, it is assumed that the adaptive filter 6300 implements both the control on $R_{OFF}$ and on $X_{MULT}$. It will however be clear that embodiments are possible in which only one of those controls is possible.

In general, any of $X_{MULT}$ and/or $R_{OFF}$ can be calculated based on any of $I_{OUT\_PRED}$ and/or $I_{BST\_PRED}$. In some preferred embodiments, any of any of $X_{MULT}$ and/or $R_{OFF}$ can be calculated based on both of $I_{OUT\_PRED}$ and/or $I_{BST\_PRED}$.

In particular, the coefficient computing logic 3430 can be configured so that if at least one among $I_{OUT\_PRED}$ and/or $I_{BST\_PRED}$ is above a predetermined threshold, then at least one of $X_{MULT}$ is reduced and/or $R_{OFF}$ is increased. In other words, the coefficient computing logic 3430 can be configured so that if at least one among the currents is above a predetermined threshold, then the filtering of filter 6300 is increased, so that it can be ensured that the driving circuit can operate correctly, in particular without introducing artefacts due to saturation and/or limitation and/or protection circuits.

The thresholds for $I_{OUT\_PRED}$ and/or $I_{BST\_PRED}$ can thus be selected depending on the maximum respective current which can be sustained by the circuit and/or by the load and/or by the power supply. It will be clear to those skilled in the art how specific values of the threshold can be selected, depending on specific circuit configuration.

Thus, the coefficient computing logic 3430 can be configured to act on at least one of $X_{MULT}$ and/or $R_{OFF}$ if at least one among $I_{OUT\_PRED}$ and/or $I_{BST\_PRED}$ is above a predetermined threshold, so as to change the operation of filter 6300. While both $X_{MULT}$ and/or $R_{OFF}$ have the effect of reducing the amplitude of output signal $V_{IN\_FILT}$ compared to $V_{IN}$, it will be clear to those skilled in the art that their effect is different. In particular, $X_{MULT}$ applies to all frequencies of the input signal while $R_{OFF}$ applies only to frequencies above a certain cut-off frequency.

In preferred embodiments, the combined use of both $X_{MULT}$ and $R_{OFF}$ can thus be particularly advantageous. For instance, if a signal which is causing one of the calculated currents to pass its respective threshold is at a frequency lower than the cut-off frequency, increasing $R_{OFF}$ will provide no effect. Similarly, if said signal is only slightly above the cut-off frequency, it would necessitate a strong increase of $R_{OFF}$, while a more moderate decrease of $X_{MULT}$ might achieve the same result without limiting too much the other frequencies in the signal.

This can be achieved by advantageously configuring the computing logic 3430 to act on both $X_{MULT}$ and $R_{OFF}$ if at least one among $I_{OUT\_PRED}$ and/or $I_{BST\_PRED}$ is above a predetermined threshold. In preferred embodiments, where action is taken on both coefficients, it can be further preferred to configuring the computing logic 3430 so that, of the total filtering applied by filter 6300, more filtering is achieved by increasing $R_{OFF}$ than by reducing $X_{MULT}$.

Alternatively, or in addition, the computing logic 3430 can be configured to act $R_{OFF}$ at first and, if an increase of until a predetermined threshold does not suffice to bring the computed current, or the computed currents, below the respective threshold, then the computing logic 3430 can further act $X_{MULT}$, alone or in combination with $R_{OFF}$.

Although throughout the description embodiments are described with reference to the roll-off value of the filter 6310, in further alternative embodiments similar results can be obtained by acting on the cut-off frequency of the filter 6310, instead of, or in addition to, the action on the roll-off value. Thus, in the description, when reference is made to the increase of $R_{OFF}$, alternative embodiments can be implemented in which this can be replaced by, or added to, the decrease of the cut-off frequency. The same applies vice versa, for the decrease of $R_{OFF}$.

While above the general operation of the computing logic 3430 and of the filter 6300 have been provided, further specific possible implementations will be described in the following. It will be clear to those skilled in the art that the invention is not limited to those specific implementations.

In particular, in some embodiments, the adaptive filter 6300 can comprise the variable low-pass filter 6310 having as controlling input at least the roll-off coefficient $R_{OFF}$, and the computing logic 3430 can be configured to compute the roll-off coefficient $R_{OFF}$ as a function of the calculated boost current $I_{BST\_PRED}$ and/or of the calculated output current $I_{OUT\_PRED}$, preferably as previously described.

Figure 7:
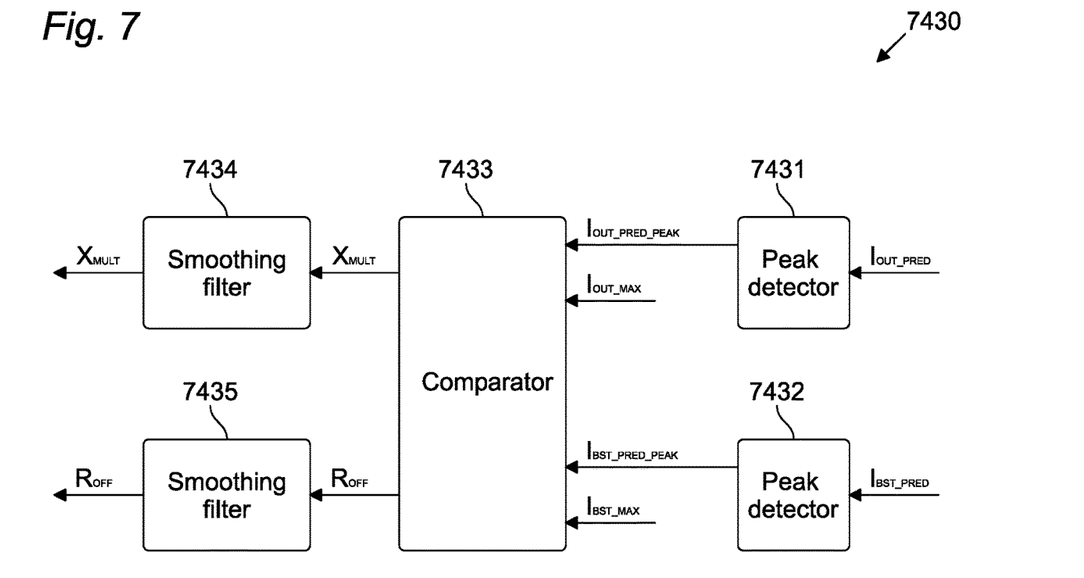
FIG. 7 schematically illustrates possible components of a coefficient computing logic 7430.

Moreover, in some embodiments, the adaptive filter 6300 can comprise the multiplier 6320 having as controlling input at least the multiplier coefficient $X_{MULT}$, and the computing logic 7430 can be configured to compute the multiplier coefficient $X_{MULT}$ as a function of the calculated boost current $I_{BST\_PRED}$ and/or of the calculated output current $I_{OUT\_PRED}$, preferably as previously described.

In some preferred embodiments, a smoothing filter, not illustrated, can be applied to the coefficient $X_{MULT}$ and/or $R_{OFF}$. Preferably, the smoothing filter can have an attack time slow enough to avoid artefacts in the driving signal of the load L. In particular, if the load L is a piezoelectric speaker, the smoothing filter can be configured to have an attack time slow enough to avoid audible artefacts in the audio signal outputted by the speaker. That is, thanks to the presence of the smoothing filter it is possible to avoid an abrupt variation of the respective coefficient, which could generate artefacts.

Specific values for the attack time will thus be depending on the specific configuration of the circuit and/or of the load. As a reference value, in some preferred embodiments, the attack time is preferably in the range of 1-100 ms, even more preferably 50-500 ms.

In the embodiments implementing the filter with a smoothing filter having an attack time higher than zero, if a local maximum occurs in the current prediction, the attack time might not react fast enough to prevent the overcurrent condition, which might then lead to artefacts due to possible current limitations. In those embodiments, the filtering based on the multiplier 6320 is thus particular advantageous, as it can react faster to the local overcurrent situation.

In preferred embodiments, the coefficient $X_{MULT}$ can advantageously correspond to a ratio of a current threshold for $I_{OUT\_PRED}$ and/or $I_{BST\_PRED}$, and the value of $I_{OUT\_PRED}$ and/or $I_{BST\_PRED}$ which has been detected as being over the respective threshold. As an example, if $I_{OUT\_PRED}$ is at 110% of the respective threshold, the coefficient $X_{MULT}$ can advantageously correspond to 100/110, so that the multiplication by multiplier 6320 can bring the signal back to a level which does not result in an overcurrent situation.

In those embodiments operating based on both $I_{OUT\_PRED}$ and $I_{BST\_PRED}$, if both current thresholds for $I_{OUT\_PRED}$ and $I_{BST\_PRED}$ are overcome by the respective currents, the coefficient $X_{MULT}$ can preferably correspond to the lower of the two ratios computed as described above.

In further preferred embodiments, the operation of the multiplier 6320 can be advantageously limited to a time range corresponding to the attack time of the smoothing filter, so as to allow sufficient filtering also in this time region. Alternatively, the multiplier 6320 can be configured to provide a higher filtering in time range corresponding to the attack time of the filter than in the subsequent time range.

In the description above it has thus been exemplified how the filter 2300 can provide various kinds of filtering based on the feedback received by the dynamic model 2400. In general, the operation of the dynamic model has been exemplified as being based on the computation of one or more currents and the comparison of those currents to predetermined thresholds, by the coefficient computing logic 3430, in order to output signals indicative of overcurrent situations. This comparison can be implemented by the coefficient computing logic 3430 in a plurality of manners which are per se known, for instance by implementing a comparator based on a differential amplifier, when operating with analog signals, or a digital comparator, when operating with digital signals.

In the following, further specific embodiments will be described in which particularly advantageous implementations for the comparison are described, with reference to FIG. 7.

In particular, as visible in FIG. 7, in some embodiments the coefficient computing logic 7430, which can be a possible further implementation of the coefficient computing logic 3430, can comprise a first peak detector 7431 and/or a second peak detector 7432.

The first peak detector 7431 is configured to receive as input the calculated amplifier current $I_{OUT\_PRED}$ and determine a maximum calculated amplifier current $I_{OUT\_PRED\_MAX}$ as a maximum value of the calculated amplifier current $I_{OUT\_PRED}$. Similarly, the second peak detector 7432 is configured to receive as input the calculated boost current $I_{BST\_PRED}$ and determine a maximum calculated boost current $I_{BST\_PRED\_MAX}$ as a maximum value of the calculated boost current $I_{BST\_PRED}$.

The coefficient computing logic 7430 can further comprises a comparator 7433 configured to compare the maximum calculated amplifier current $I_{OUT\_PRED\_MAX}$ with a predetermined maximum amplifier current $I_{OUT\_MAX}$, and/or compare the maximum calculated boost current $I_{BST\_PRED\_MAX}$ with a predetermined maximum boost current $I_{BST\_MAX}$, and output at least one coefficient $R_{OFF}$, $X_{MULT}$ based on a result of the comparison.

Concerning the specific changes to the one or more coefficient as a function of the one or more inputs, reference is made to the previously described embodiments. In particular, where previously reference has been made to a comparison of $I_{OUT\_PRED}$ and $I_{BST\_PRED}$ with the respective thresholds, similar considerations can apply to the comparison of $I_{OUT\_PRED\_PEAK}$ and $I_{BST\_PRED\_PEAK}$ with the respective thresholds, namely $I_{OUT\_MAX}$ and $I_{BST\_MAX}$.

The introduction of the peak detectors allow to consider the part of the current signals which lead to the overcurrent situations. This simplifies the input to the comparator 7433, which only has to operate on peak values and not on the complete signals. In some preferred embodiments, the peak detectors preferably output the maximum amplitude of their respective inputs. In some further preferred embodiments, they might also output information concerning the duration of the maximum amplitude, for instance in absolute and/or relative terms. This timing information can also be used by the comparator, by comparing it with respective timing thresholds, not illustrated. In this manner, if the timing information outputted by the peak detector is not higher than the respective threshold, the comparator can be configured to take no action of its outputs. This might be useful, for instance, to avoid reacting to very narrow peaks and/or spikes caused by noise, short transitory effects and/or measurement errors.

As an alternative to this approach, and as visible in FIG. 7, the coefficient computing logic 7430 can comprises at least one smoothing filter 7434, 7435 configured to receive as input the at least one coefficient $R_{OFF}$, $X_{MULT}$, and to output the at least one coefficient $R_{OFF}$, $X_{MULT}$ after application of the least one smoothing filter 7434, 7435.

In this manner it can be abrupt changes in the transfer function of filter 2300 can be avoided. This avoid abrupt changes in the signal filtered by filter 2300, which could cause artefacts, for instance audible artefacts in case of using the circuit for driving a speaker as load. The optional smoothing filters thus provide a simple and effective way to low pass the output of the computing logic 743. In preferred embodiments, the one or more smoothing filter could be implemented by low-pass filters.

It will further be clear that the implementation of the smoothing filter 7434 is independent from the implementation of the smoothing filter 7435. Moreover, those skilled in the art will appreciate that the characteristics of the smoothing filters 7434 and 7435 do not need to be the same. In particular, each of them can have its own attack and/or release time, which can be programmed to trade between avoiding audible artefacts and maximizing the algorithm effectiveness. In preferred embodiments, the attack and/or release time are preferably comprised between 10 microseconds and 1 s, even more preferably between 100 microseconds and 500 ms.

It has thus been described how various embodiments of the invention can compute one or more currents of the driving circuit and how this information can be used as a feedback loop to filter the input signal, so as to avoid introducing artefacts in the signal due overcurrent situations.

Figure 8:
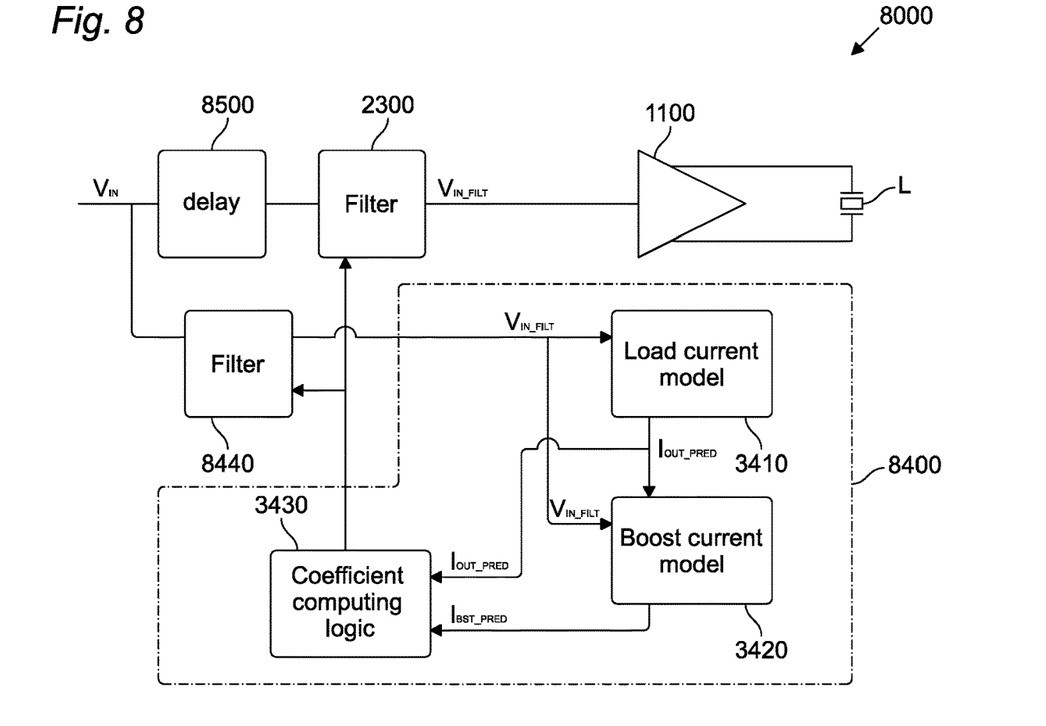
FIG. 8 schematically illustrates a driving circuit 8000.

FIG. 8 schematically illustrates a driving circuit 8000, which differs from the previously described embodiments due to, among others, the presence of a delay element 8500 connected between the input signal $V_{IN}$ and the adaptive filter 2300.

Generally, the purpose of the delay element is to allow the delay caused by the processing in the feedback loop, through the dynamic model 8400, to be compensated. in this manner it is possible to ensure that the part of the signal which is filtered by the filter 2300 is the one which was previously modelled by the dynamic model 8400.

In some preferred embodiments, the delay introduced by delay element 8500 can therefore correspond to the processing time of the dynamic model 8400. Preferably, the processing time of the dynamic model 8400 can be understood to be the time incurring between a change in one or more of its inputs and a corresponding change in one or more of its outputs.

In some practical implementations, it has been found that delays in between 0.5 ms and 5 ms offer a sufficient time for the processing of the dynamic model 8400 while not significantly negatively impacting the operation of the driving circuit.

Moreover, as visible in FIG. 8, the driving circuit 8000 differs from the previously described embodiments due to, among others, the presence of a second adaptive filter 8440 connected between the input signal $V_{IN}$ and the dynamic model 8400.

It will be clear that the filter 8440 can be implemented independently of the delay 8500. In this respect, it is noted that throughout the description, various embodiments are illustrated and/or described, each comprising a plurality of features. This is not to be limiting the invention to the specific combination of features of the embodiments as illustrated and/or described. To the contrary, any feature from any of the embodiments can be combined with any features from any remaining embodiment.

In particular, the second adaptive filter 8440 can be configured to provide substantially the same filtering of the adaptive filter 2300. Here, the term substantially can be interpreted so as to mean that the filtering provided by the second adaptive filter 8440 is such that the signal outputted to the model 8400 allows the model 8400 to operate so that, when the model 8400 drives the filter 2300, it is possible to obtain the previously described operation, and in particular to avoid overcurrent situations in the driver 1100 and/or in the load L. In other words, while the filters 2300 and 8440 do not need to provide exactly the same output, they will provide an output similar enough for allowing the operation of the model 8400 in accordance with its purpose, as previously defined.

In further embodiments, the second adaptive filter 8440 can be configured to provide a filtering within a range of +/−10% of the filtering applied by the adaptive filter 2300. In further embodiments, the second adaptive filter 8440 can be configured to provide the same filtering of filter 2300.

Moreover, the second adaptive filter 8440 can be configured to filter the input signal $V_{IN}$ based on the output of the dynamic model, in a manner similar to what has been discussed with respect to filter 2300. This ensures that the output of filter 8440 is compatible with that of filter 2300, so that the model 8400 can more precisely model the evolution of the currents in the circuit.

Figure 9:
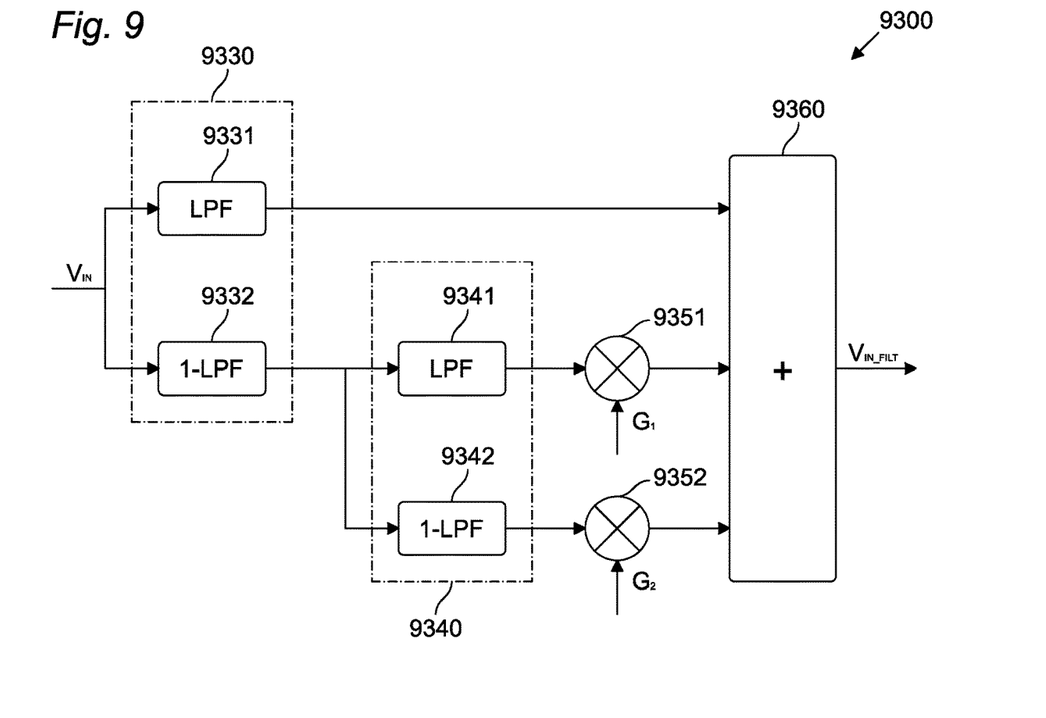
FIG. 9 schematically illustrates possible components of a filter 9300.

FIG. 9 illustrates a further possible implementation of filter 2300, in form of adaptive filter 9300. As visible in FIG. 9, the adaptive filter 9300 can comprise a plurality of low-pass filters and high-pass filters for filtering the signal $V_{IN}$ along at least two branches, preferably three. For instance, a first branch comprises low-pass filter 9331, a second branch comprises high-pass filter 9332 and low-pass filter 9341, a third branch comprises high-pass filter 9332 and high-pass filter 9342.

The output $V_{IN\_FILT}$ of the filter 9300 is obtained by combining the output of at least two branches through an adder 9360.

Preferably, before the combination, the output of one or more branches can be multiplied by a gain. For instance, the output of the second branch as illustrated is multiplied by the gain $G_1$ at multiplier 9351, while the output of the third branch as illustrated is multiplied by the gain $G_2$ at multiplier 9352.

In preferred embodiments, the high-pass filter 9332 and the low-pass filter 9331 constitute an all-pass section 9330. Similarly, the high-pass filter 9342 and the low-pass filter 9341 can constitute an all-pass section 9340.

Such configuration is particularly advantageous. In particular, it allows an easy control of the roll-off of filter 9300. In particular, when no filtering action is required, that is a roll-off value of 0 dB/decade, the filter 9300 can implement an all-pass filter by appropriately controlling $G_1$ and $G_2$ and/or by appropriately controlling the cut-off frequency of all-pass section 9330 and/or of all-pass section 9340.

In particular, in some embodiments, an iterative process can be configured to identify the low pass and the high pass filter cut off frequencies and $G_1$ and $G_2$ so that the filter 9300 is an approximation of a requested profile.

More specifically, in some embodiments $G_1$ and $G_2$ can be determined as $$G_1 = 10^{((dB \cdot delta_1)/20)}$$

$$G_2 = 10^{((dB \cdot delta_2)/20)}$$

Where dB is the desired roll off and where $delta_1$ and $delta_2$ can be determined by an iterative process as a function of the desired roll-off.

It has thus been described how the invention can provide a circuit for driving a generic capacitive load L. As it is evident from the description above, this applies to any capacitive load and has the advantage of being able to track possible variation in the capacitance and/or in the power supply when filtering the input signal, so as to avoid overcurrent situations which might lead to the presence of artefacts in the signal.

Such behavior, while desirable when driving any load L, is particularly advantageous when the capacitive load L is a speaker, and even more preferably so when the speaker is based on one or more a piezoelectric components or MEMS. Various manners are known for implementing a speaker with those technologies and are per se known.

Further it is noted that the invention can obtain the advantages described above without measuring the load L directly, but relying on measurements of voltages and/or currents across the load L and/or at the output of the driver 1000. Thus the invention can be applied to a wide range of loads, without significant changes.

While the invention has been directed to a driving circuit, it will be clear that is can also be directed to a device, such as a mobile phone, a table, a notebook, or more generally any kind of electronic device comprising a speaker, preferably based on one or more a piezoelectric components or MEMS, and a circuit according to any of the described embodiments, for driving the speaker.

Additionally, while the invention has been described in terms of an apparatus, it is evident to those skilled in the art that a corresponding method and/or computing device can be implemented.

In general, all functionalities described with reference to the dynamic model and the adaptive filter above can be implemented by corresponding method steps and/or by corresponding instructions executed by a CPU.

Figure 10:
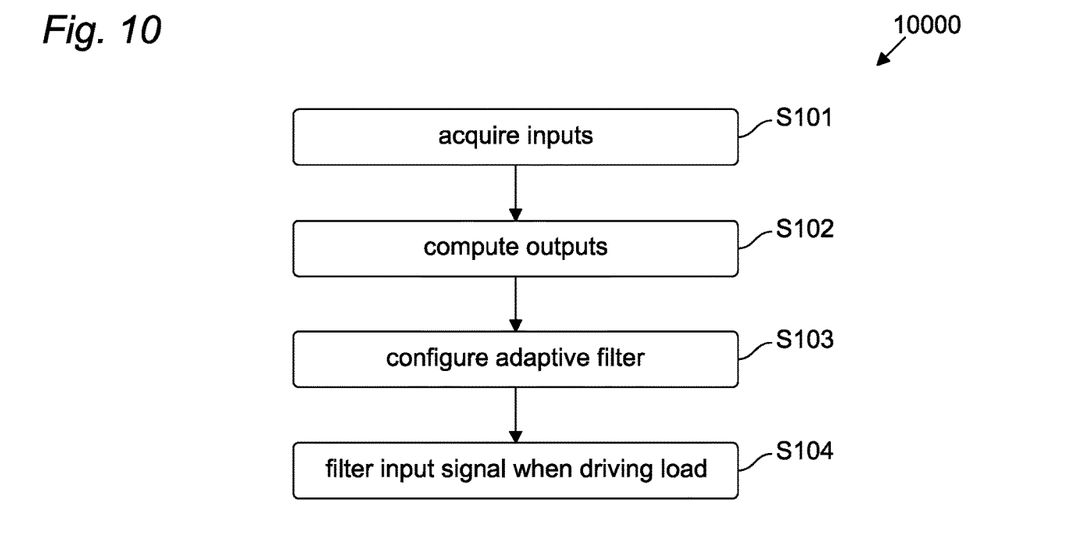
FIG. 10 schematically illustrates a driving method 10000.

For instance, FIG. 10 illustrates a method comprising steps S101-S104.

Step S101 comprises acquiring inputs for the dynamic models. The inputs can be any of the previously described inputs, such as, for instance, any of $V_{IN}$, $V_L$, $I_L$, $V_{BAT}$, η, and more generally any of the values which have been described as being inputted in the dynamic model. In preferred embodiments, the inputs tracked by the dynamic model comprise at least the capacitance $C_L$ of the load L and the voltage $V_{BAT}$ of the source used for powering at least parts of the circuit.

Step S102 comprises computing one or more outputs of the dynamic model. The outputs can be any of the previously described outputs, such as, for instance, any of $X_{MULT}$, $R_{OFF}$, $G_1$, $G_2$, η, and more generally any of the values which have been described as being outputted by the dynamic model.

Step S103 comprises configuring the filter based on the outputs of the dynamic model, as previously described, which might vary depending on the specific configuration of the filter.

Step S104 comprises filtering the input signal with the configured filter while driving the load L.

Further steps can be defined to carry out the functionalities previously described in terms of apparatus features.

Figure 11:
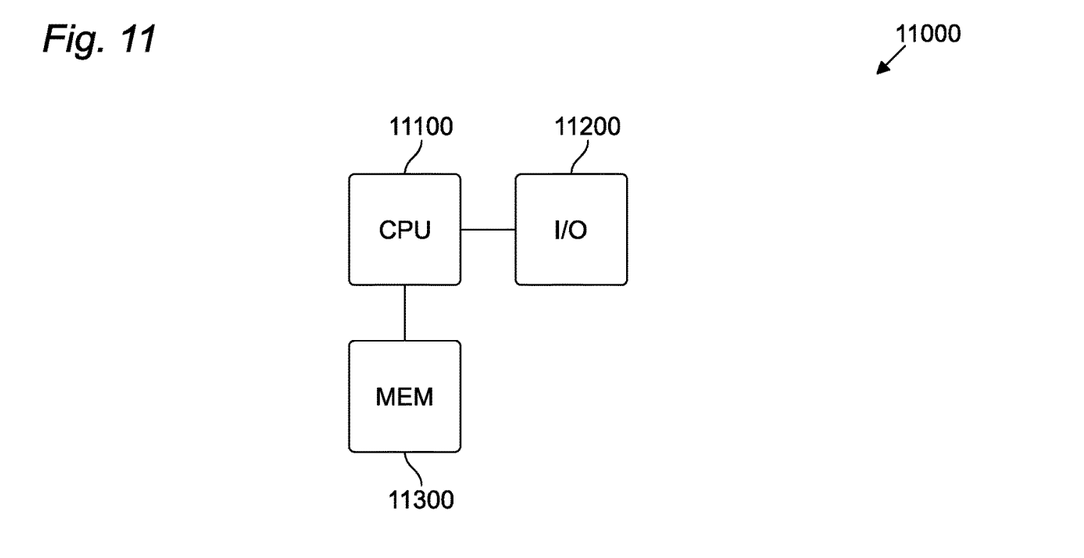
FIG. 11 schematically illustrates a computing device 11000.

Similarly, the invention can be implemented by a computing device 11000 in which the various functionalities previously described can be implemented by appropriately driving a processor. With reference to FIG. 11, the computing device 11000 can in particular comprise a processor 11000, input/output means 11200 and a memory 11300. The memory can comprise instructions which, when executed by the processor, can cause the processor to execute any of the functionalities previously described. Moreover, through input/output means 11200, possibly driven directly based on instructions from the memory and/or through the processor, it is possible to acquire the one or more inputs and provide the one or more outputs.

In particular, the invention could also be implemented as a combination of discrete components and a computing device. Preferably, the computing device could be used to implement the dynamic model and/or the various filters, while discrete components could be used for the remaining features, and notably for the driver.

It has therefore been shown how a capacitive load can be driven in an efficient way, taking into account real-world conditions and not based on worst-case assumptions. This allows the load to be driven without needlessly sacrificing driving power which is instead available and can be used without generating artefacts in the driving signal. At the same time, the configuration of the invention allows the amplification to be reduced in real-time for the conditions of load, power supply and driving signal which would otherwise lead to the generation of artefacts.

While several embodiments with various feature have been discussed and/or illustrated, it will be clear to those skilled in the art that the invention is not limited to those specific combinations of features. Instead, further embodiments can be obtained by combining features separately from one or more embodiments, within the scope of the claims.

LIST OF REFERENCE NUMERALS

1000A: driving circuit
1100: amplifier
1200A: low pass filter
1210: resistance
L: capacitive load
1000B: driving circuit
1200B: low pass filter
1000C: driving circuit
1300: adaptive filter
1400: load model
2000: driving circuit
2300: adaptive filter
2400: dynamic model
$V_{IN}$: input signal
$V_L$: measured load voltage
$I_L$: measured load current
$C_L$: load capacitance
$V_{BAT}$: source voltage
3000: driving circuit
3100: amplifier
3110: boost converter
3120: driver
3400: dynamic model
3410: load current model
3420: boost current model
3430: coefficient computing logic
$I_{OUT\_PRED}$: calculated amplifier current
$I_{BST\_PRED}$: calculated boost current
4410: load current model
4411: load capacitance model
4412: amplifier model
4413: current calculator
$C_{L\_PRED}$: calculated load capacitance
$V_{OUT\_PRED}$: expected amplifier output voltage
5420: boost current model
5421: current calculator
θ: boost converter efficiency
6300: adaptive filter
6310: low-pass filter
6320: multiplier
7430: coefficient computing logic
7431, 7432: peak detector
7433 comparator
7434, 7435: smoothing filter
8000: driving circuit 8400: dynamic model
8440: delay
8500: delay
9300: adaptive filter
9330: all-pass section
9331: low pass filter
9332: high pass filter
9340: all-pass section
9341: low pass filter
9342: high pass filter
9351, 9352: multiplier
9360: adder
10000: method
S101: acquiring inputs
S102: computing outputs
S103: configuring filter
S104: filtering signal
11000: computing unit
11100: processor
11200: Input/Output
11300: memory

What is claimed is:

1. A circuit for driving a capacitive load comprising:
an amplifier that drives the load based on an input signal, the amplifier comprising at least a boost converter,
a dynamic model that tracks a capacitance of the load and a voltage from a power source that powers at least parts of the circuit including the amplifier, and
an adaptive filter that filters the input signal based on an output of the dynamic model.

2. The circuit according to claim 1,
wherein the dynamic model comprises
a load current model configured to output a calculated amplifier current, $I_{OUT\_PRED}$, the calculated amplifier current being a current expected to be outputted by the amplifier as a function of at least the input signal, $V_{IN}$, and of the tracked capacitance of the load, and/or
a boost current model configured to output a calculated boost current, the calculated boost current being a current expected to be outputted by an inductor of the boost converter as a function of at least the input signal and the voltage of the source.

3. The circuit according to claim 2, wherein the load current model is configured to
receive as input $V_L$ a value representative of the voltage across the load,
receive as input $I_L$ a value representative of the current across the load,
receive as input $V_{IN}$ a value representative of the input signal, and
output the calculated amplifier current $I_{OUT\_PRED}$ as $$I_{OUT\_PRED} = f(V_{IN} * Y_L)$$

where $Y_L$ is the admittance of the load and where f is a bijective function.

4. The circuit according to claim 3, wherein the load current model comprises a model of a voltage to current transfer function of the load.

5. The circuit according to claim 2, wherein the load current model comprises
a load capacitance model configured to output a calculated capacitance value of the load calculated from $V_L$ and $I_L$, where $V_L$ is an input value representative of the voltage across the load and where $I_L$ is an input value representative of the current across the load, an amplifier model configured to output an expected output voltage, $V_{OUT\_PRED}$, of the amplifier calculated from the input signal, $V_{IN}$, a current calculator configured to calculate a calculated amplifier current, $I_{OUT\_PRED}$, based on the calculated capacitance value of the load and on the expected output voltage, $V_{OUT\_PRED}$, where:

$$I_{OUT\_PRED}=f(V_{OUT\_PRED}*Y_L)$$

where f is a bijective function, and $Y_L$ is admittance of the load and is based on the calculated capacitance value of the load.

6. The circuit according to claim 5, wherein the load capacitance model comprises a least mean square filter.

7. The circuit according to claim 2, wherein the boost current model is configured to receive as input $V_{BAT}$ a value representative of the voltage across the source, receive as input η a value representative of an efficiency of the boost converter, receive as input $I_{OUT\_PRED}$ a value representative of the calculated amplifier current, receive as input $V_{IN}$ a value representative of the input signal, output the calculated boost current $I_{BST\_PRED}$ as $$I_{BST\_PRED}=f[V_{OUT\_PRED}*I_{OUT\_PRED}/(\eta*V_{BAT})]$$

where f is a bijective function and $V_{OUT\_PRED}$ is an expected output voltage of the amplifier.

8. The circuit according to claim 2, wherein the dynamic model further comprises a coefficient computing logic configured to receive as input the calculated amplifier current and/or the calculated boost current, output at least one coefficient for controlling the adaptive filter based on values of at least one of the calculated amplifier current and the calculated boost current.

9. The circuit according to claim 8, wherein the adaptive filter comprises a variable low-pass filter having as controlling input at least a roll-off coefficient, and the computing logic is configured to compute the roll-off coefficient as a function of the calculated boost current and/or of the calculated output current.

10. The circuit according to claim 1, further comprising a delay element upstream of the adaptive filter and configured to act on the input signal.

11. The circuit according to claim 1, further comprising a second adaptive filter positioned upstream from the dynamic model, wherein the second adaptive filter is configured to provide substantially the same filtering of the adaptive filter, wherein the second adaptive filter is configured to filter the input signal based on the output of the dynamic model.

12. The circuit according to claim 1, wherein the adaptive filter comprises a plurality of low-pass filters and high-pass filters for filtering the input signal along at least two branches.

13. The circuit according to claim 1, wherein the capacitive load is speaker based on one or more a piezoelectric components or MEMS.

14. The circuit according to claim 1, wherein the adaptive filter comprises a plurality of low-pass filters and high-pass filters for filtering the input signal along three branches.

15. A device comprising a speaker and a circuit according to claim 1 for driving the speaker.

16. A computing unit comprising a processor and a non-transitory computer readable memory, the memory comprising instructions which, when executed by the processor, cause the processor to operate as the circuit of claim 1.

* * * * *

UNITED STATES PATENT AND TRADEMARK OFFICE
CERTIFICATE OF CORRECTION

| | |
|---|---|
| PATENT NO. | : 11,799,453 B2 |
| APPLICATION NO. | : 17/698033 |
| DATED | : October 24, 2023 |
| INVENTOR(S) | : Francesco Rezzi et al. |

It is certified that error appears in the above-identified patent and that said Letters Patent is hereby corrected as shown below:

In the Specification

Column 11, Line 18: "$V^{IN}$," should read -- $V_{IN}$, --

Column 11, Line 20: "$I_{BST\_PRED} = f\,[V_{OUT} * I_{OUT\_PRED}(\eta * V_{BAT})]$" should read
-- $I_{BST\_PRED} = f\,[V_{OUT} * I_{OUT\_PRED} / (\eta * V_{BAT})]$ --

Column 19, Line 59: "0: boost converter efficiency" should read -- $\eta$: boost converter efficiency --

Signed and Sealed this
Eleventh Day of June, 2024

Katherine Kelly Vidal
*Director of the United States Patent and Trademark Office*